(12) United States Patent
Huang et al.

(10) Patent No.: US 6,865,082 B2
(45) Date of Patent: Mar. 8, 2005

(54) HEAT DISSIPATING ASSEMBLY

(75) Inventors: Chun-Hsien Huang, Taipei Hsien (TW); Tsai Wen-Yuan, Taipei Hsien (TW); Chao-Teh Ho, Taipei Hsien (TW); King-Tung Huang, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 50 days.

(21) Appl. No.: 10/339,018

(22) Filed: Jan. 8, 2003

(65) Prior Publication Data

US 2004/0052054 A1 Mar. 18, 2004

(30) Foreign Application Priority Data

Sep. 18, 2002 (TW) ........................................ 91214726 U

(51) Int. Cl.⁷ ................................................. H05K 7/20
(52) U.S. Cl. ................. 361/700; 165/80.3; 165/104.33; 257/719; 361/704; 361/710; 361/719; 361/720
(58) Field of Search .............................. 165/80.2, 80.3, 165/104.33, 121–122, 126, 185; 24/457–458, 295–296, 573; 257/718–719, 726–727; 361/760–701, 697, 694–695, 719–721; 248/505, 510

(56) References Cited

U.S. PATENT DOCUMENTS

| 6,046,905 A | * | 4/2000 | Nelson et al. | ............... | 361/704 |
| 6,097,601 A | * | 8/2000 | Lee | ............................ | 361/704 |
| 6,141,220 A | * | 10/2000 | Lin | ............................ | 361/704 |
| 6,449,154 B1 | * | 9/2002 | Yoneyama et al. | ......... | 361/704 |
| 6,473,306 B2 | * | 10/2002 | Koseki et al. | .............. | 361/704 |
| 6,492,202 B1 | * | 12/2002 | Lober et al. | ................ | 438/122 |

* cited by examiner

Primary Examiner—Gregory D. Thompson
(74) Attorney, Agent, or Firm—Ladas & Parry LLP

(57) ABSTRACT

In a heat dissipating assembly, a base frame is disposed underneath a circuit board and includes a bottom part with opposite first and second sides that are formed with first and second engaging units, respectively. The first and second engaging units extend upwardly through a set of through holes in the circuit board. A heat-dissipating module is mounted on the circuit board and includes a heat transfer plate to establish heat-conductive contact with an electronic component on the circuit board. An anchoring device includes a first anchoring unit that engages the first engaging unit, a second anchoring unit that engages the second engaging unit, and an abutting unit connected to the first and second anchoring units. The anchoring device biases the heat transfer plate toward the electronic component when the first and second anchoring units engage the first and second engaging units.

7 Claims, 9 Drawing Sheets

HEAT DISSIPATING ASSEMBLY

CROSS-REFERENCE TO RELATED APPLICATION

This application claims priority of Taiwanese Application No. 091214726, filed on Sep. 18, 2002.

BACKGROUND OF THE INVENTION

1. Field of the Invention

The invention relates to a heat dissipating assembly, more particularly to a heat dissipating assembly that can provide an even biasing force when applied to establish heat-conductive contact with an electronic component.

2. Description of the Related Art

FIGS. 1 and 2 illustrate a conventional heat dissipating device 8 provided on a circuit board 6 in a notebook computer (not shown) for dissipating heat generated by a central processing unit (CPU) 7 that is mounted on a first surface 61 of the circuit board 6 and that has an exposed die portion 71. The circuit board 6 further has a second surface 62 opposite to the first surface 61, and is formed with four through holes 63 extending from the first surface 61 to the second surface 62 and arranged around the CPU 7.

The conventional heat dissipating device 8 includes a heat transfer plate 81, a heat-conducting pipe 80 connected to the heat transfer plate 81, a heat sink 84 connected to the heat-conducting pipe 80 and mounted on the circuit board 6, and a base plate 82. The base plate 82 is disposed on the second surface 62 of the circuit board 6, and has four screw seats 822 extending upwardly therefrom. Each screw seat 822 extends through a corresponding one of the through holes 63 in the circuit board 6, and is formed with a screw hole 823. The heat transfer plate 81 is formed with four through holes 812 corresponding to the through holes 63 in the circuit board 6. Four spring-loaded screw fasteners 83 extend through the through holes 81 in the heat transfer plate 8 and the through holes 63 in the circuit board and engage in the screw holes 823 in the screw seats 822, respectively, such that the heat transfer plate 81 is secured on top of the CPU 7 to establish heat-conductive contact with the CPU 7.

During assembly, the screw fasteners 83 are threaded to the screw seats 822 one at a time. Therefore, as shown in FIG. 2, different pressures act on the different corners of the die portion 71 during threading of the screw fasteners 83. The different pressures, which may be higher than a suggested pressure of 100 psi, applied by the screw fasteners 83 may result in damage to the die portion 71 that would necessitate replacement of the damaged CPU.

SUMMARY OF THE INVENTION

Therefore, the object of the present invention is to provide a heat dissipating assembly that can be mounted easily and evenly on a circuit board.

According to one aspect of the present invention, a heat dissipating assembly is adapted to be provided on a circuit board for dissipating heat produced by an electronic component that is mounted on a first surface of the circuit board. The circuit board further has a second surface opposite to the first surface, and is formed with a set of through holes, each of which extends from the first surface to the second surface. The heat dissipating assembly comprises:

a base frame adapted to be disposed on the second surface of the circuit board and including a bottom part with first and second sides opposite to each other in a first direction, the first side being formed with a first engaging unit extending upwardly therefrom, the second side being formed with a second engaging unit extending upwardly therefrom, each of the first and second engaging units being adapted to extend through the through holes in the circuit board;

a heat-dissipating module adapted to be mounted on the circuit board and including a heat transfer plate adapted to be disposed on and to establish heat-conductive contact with the electronic component; and an anchoring device including a first anchoring unit that engages the first engaging unit, a second anchoring unit that engages the second engaging unit, and an abutting unit connected to the first and second anchoring units, the anchoring device biasing the heat transfer plate of the heat-dissipating module toward the electronic component when the first and second anchoring units engage the first and second engaging units.

According to another aspect of the present invention, an electronic device comprises:

an electronic component;

a circuit board having a first surface provided with the electronic component thereon, and a second surface opposite to the first surface, the circuit board being formed with a set of through holes, each of which extends from the first surface to the second surface; and a heat dissipating assembly provided on the circuit board for dissipating heat produced by the electronic component, the heat dissipating assembly including a base frame disposed on the second surface of the circuit board and including a bottom part with first and second sides opposite to each other in a first direction, the first side being formed with a first engaging unit extending upwardly therefrom, the second side being formed with a second engaging unit extending upwardly therefrom, each of the first and second engaging units extending through the through holes in the circuit board, a heat-dissipating module mounted on the circuit board and including a heat transfer plate that is disposed on the electronic component for establishing heat-conductive contact therewith, and an anchoring device including a first anchoring unit that engages the first engaging unit, a second anchoring unit that engages the second engaging unit, and an abutting unit connected to the first and second anchoring units, the anchoring device biasing the heat transfer plate of the heat-dissipating module toward the electronic component when the first and second anchoring units engage the first and second engaging units.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
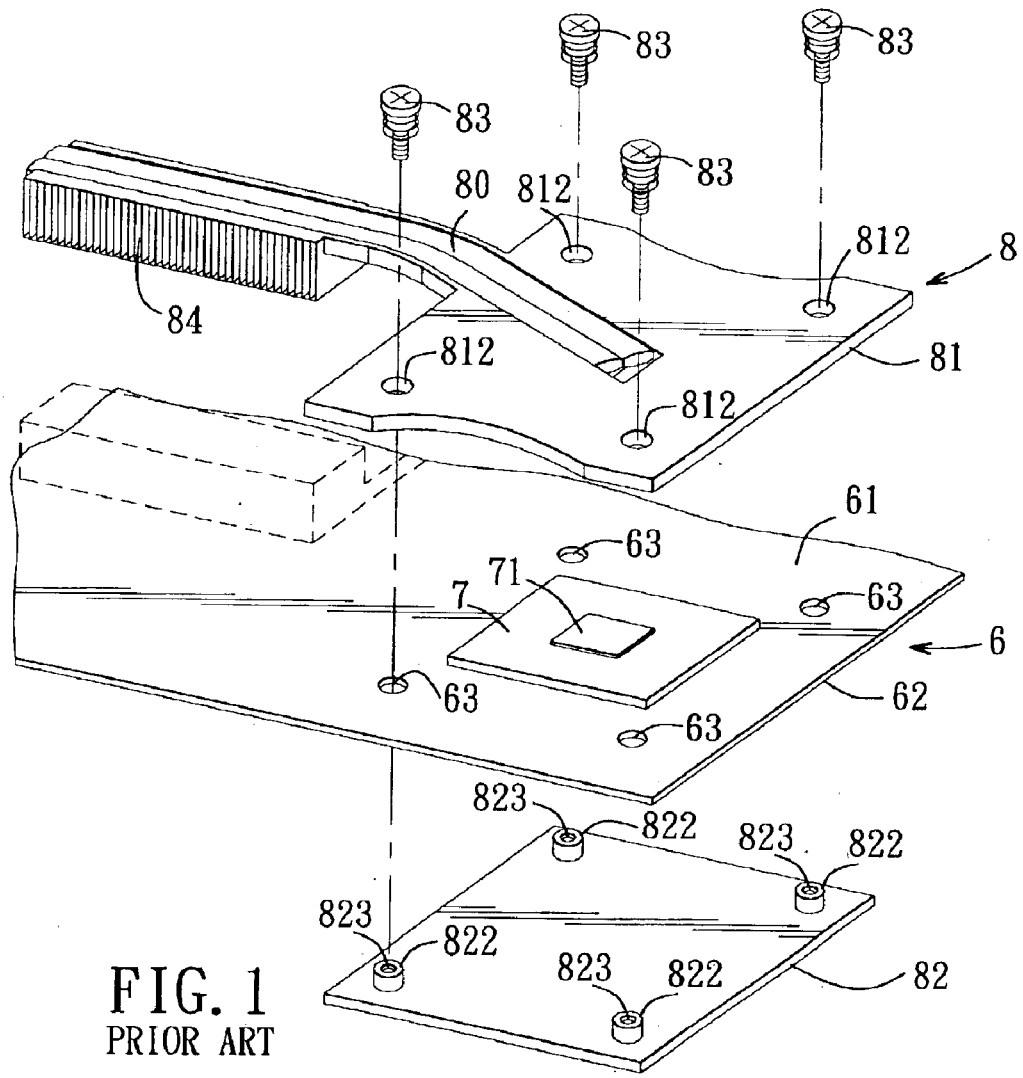
FIG. 1 is an exploded perspective view showing a conventional heat dissipating assembly.
Figure 2:
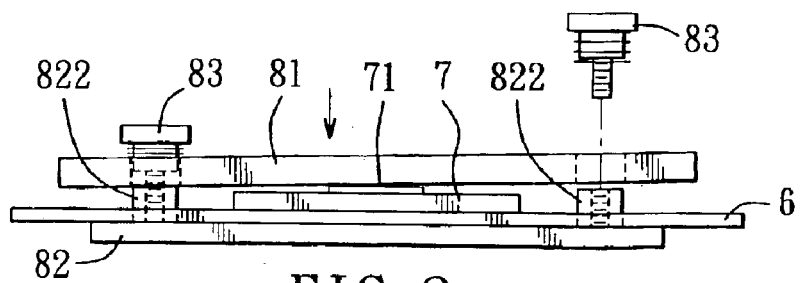
FIG. 2 is a schematic side view showing the conventional heat dissipating assembly during assembly.

Before the present invention is described in greater detail, it should be noted that like elements are denoted by the same reference numerals throughout the disclosure.

Figure 3:
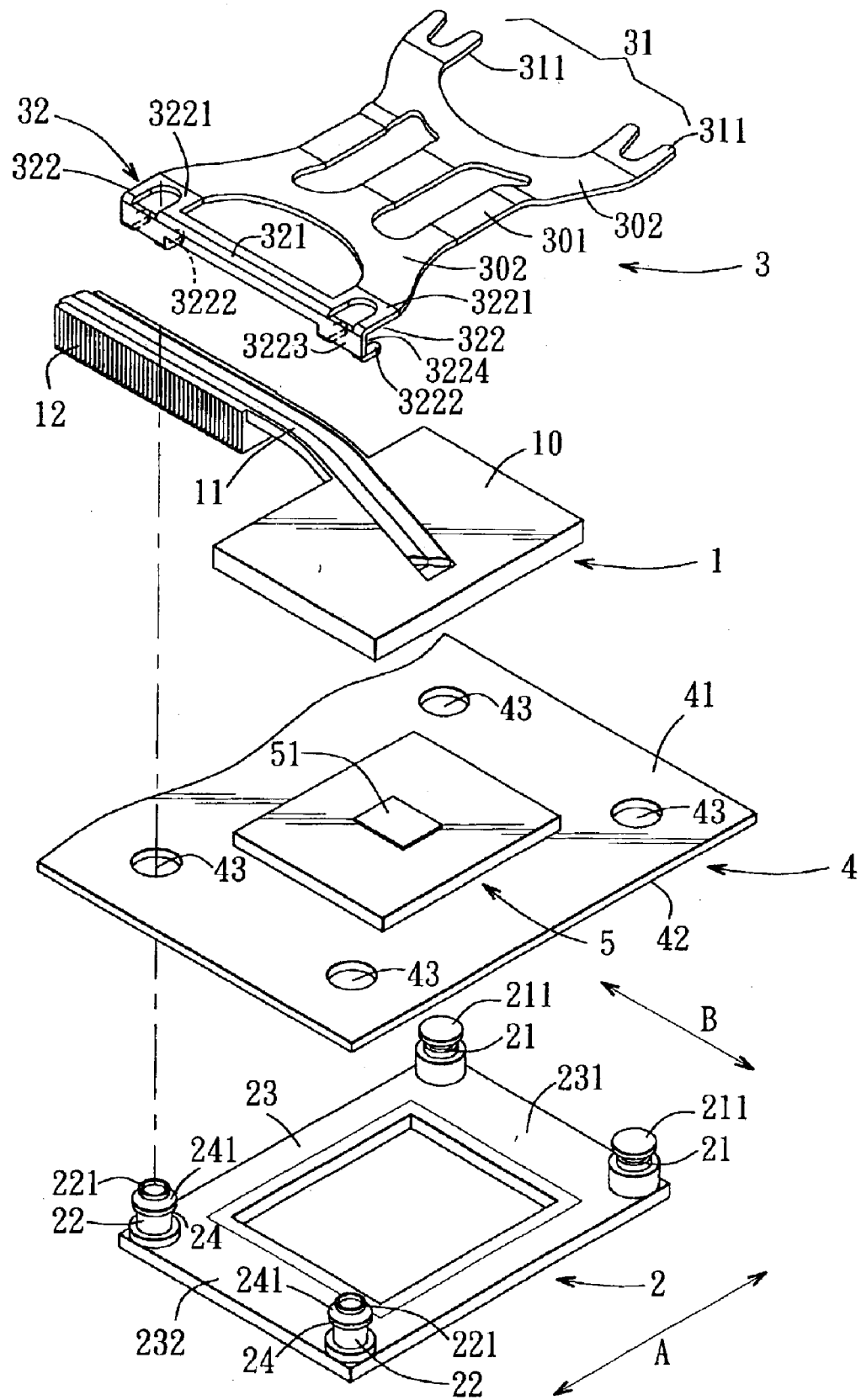
FIG. 3 is an exploded perspective view showing the first preferred embodiment of a heat dissipating assembly according to the present invention.
Figure 4:
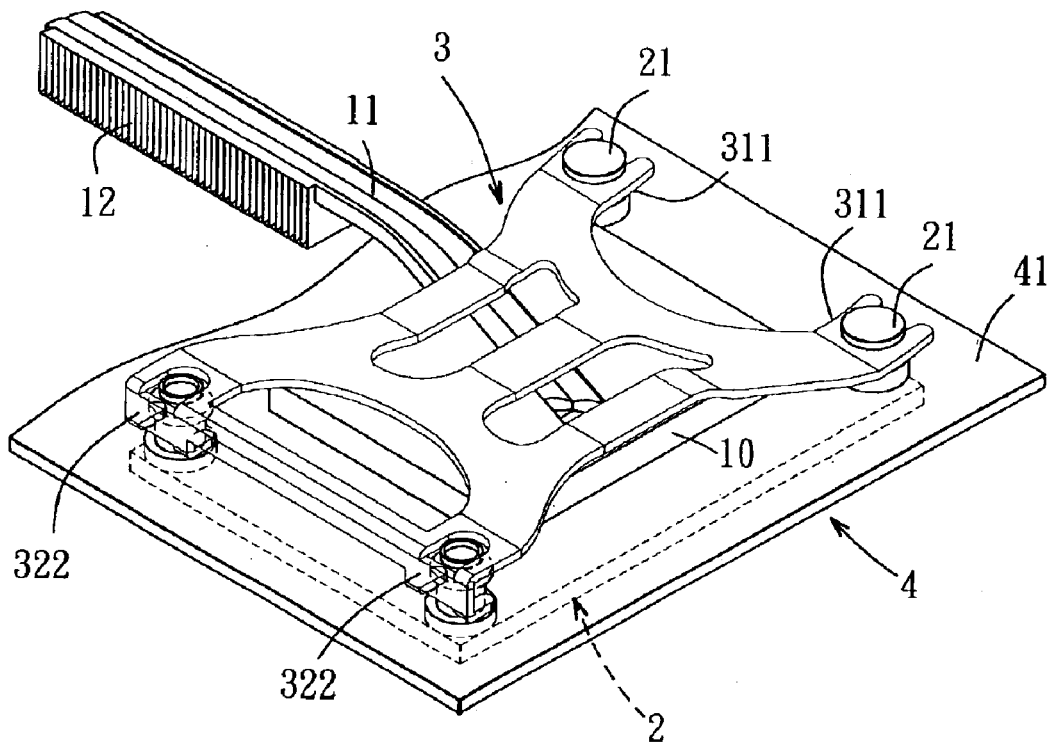
FIG. 4 is a perspective view showing the first preferred embodiment.

Referring to FIGS. 3 and 4, the first preferred embodiment of a heat dissipating assembly according to the present invention is shown to include a base frame 2, a heat-dissipating module 1, and an anchoring device 3, and is adapted to be provided on a circuit board 4 that can be applied to an electronic device, such as a notebook computer, for dissipating heat produced by an electronic component 5, such as a CPU, that is mounted on a first surface 41 of the circuit board 4. The circuit board 4 further has a second surface 42 opposite to the first surface 41, and is formed with a set of circular through holes 43, each of which extends from the first surface 41 to the second surface 42. The electronic component 5 has an exposed die portion 51.

The base frame 2 is adapted to be disposed on the second surface 42 of the circuit board 4, and includes a bottom part 23 with first and second sides 231, 232 opposite to each other in a first direction (A). The first side 231 is formed with a first engaging unit extending upwardly therefrom. The second side 232 is formed with a second engaging unit extending upwardly therefrom. Each of the first and second engaging units is adapted to extend through the through holes 43 in the circuit board 4. In this embodiment, the first engaging unit includes a pair of first engaging posts 21 spaced apart from each other in a second direction (B) that is transverse to the first direction (A). Each of the first engaging posts 21 has a diameter-reduced neck portion 211. The second engaging unit includes a pair of second engaging posts 22 spaced apart from each other in the second direction (B), and two enlarged head portions 24, each of which is provided on a top end 221 of a corresponding one of the second engaging posts 22 and is formed with a convex top surface 241.

The heat-dissipating module 1 is adapted to be mounted on the circuit board 4. The heat-dissipating module 1 includes a heat transfer plate 10, a heat-conducting pipe 11 connected to the heat transfer plate 10, and a heat sink 12 connected to the heat-conducting pipe 11. The heat transfer plate 10 is adapted to be disposed on and to establish heat-conductive contact with the electronic component 5.

Figure 4A:
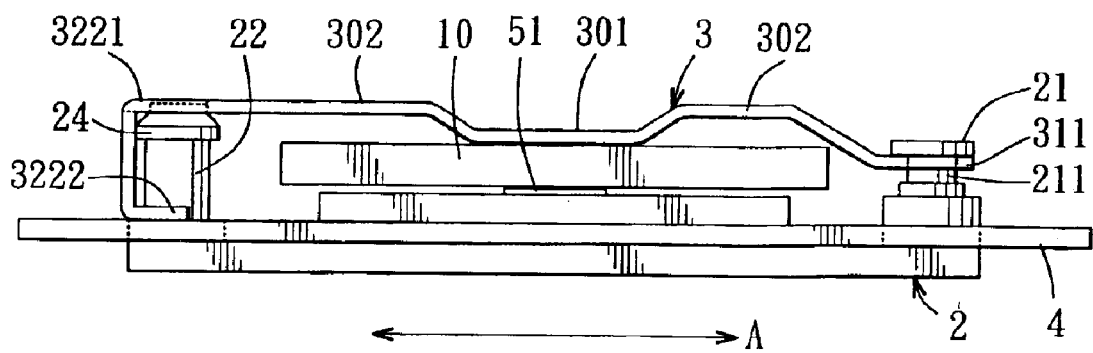
FIG. 4A is a schematic side view showing the first preferred embodiment.

The anchoring device 3 includes a first anchoring unit 31 that engages the first engaging unit, a second anchoring unit 32 that engages the second engaging unit, and an abutting unit 33 connected to the first and second anchoring units 31, 32. The anchoring device 3 biases the heat transfer plate 10 of the heat-dissipating module 1 toward the electronic component 5 when the first and second anchoring units 31, 32 engage the first and second engaging units. In this embodiment, the first anchoring unit 31 includes a pair of forked plates 311 that engage the neck portions 211 of the first engaging posts 21, respectively. The second anchoring unit 32 includes a pair of U-shaped plates 322, each of which has upper and lower plate portions 3221, 3222, and an intermediate plate 3223 interconnecting the upper and lower plate portions 3221, 3222. The lower plate portion 3222 of each U-shaped plate 322 is formed with a notch 3224 that is slightly smaller than a largest diameter of the head portion 241 on the respective second engaging post 22. The second anchoring unit 32 further has a coupling plate 321 interconnecting the U-shaped plates 322. When the second anchoring unit 32 engages the second engaging unit, the second engaging posts 22 engage the notches 3224, respectively, and the head portions 24 are retained between the upper and lower plate portions 3221, 3222, as shown in FIG. 4. The abutting unit 30 includes an abutting plate 301, and opposite resilient lateral plates 302 extending in the first direction (A) and inclining upwardly from opposite sides of the abutting plate 301, as best shown in FIG. 4A, and connected respectively to the forked plates 311 and the upper plate portion 3221 of the U-shaped plates 322. The forked portions 311, the U-shaped plates 322, the coupling plate 321, the resilient lateral plates 302 and the abutting plate 301 are formed integrally by stamping.

During assembly, the base frame 2 is first disposed on the second surface 42 of the circuit board 4 such that the first engaging posts 21 of the first engaging unit and the second engaging posts 22 of the second engaging unit extend through the through holes 43 in the circuit board 4. Then, the forked plates 311 of the first anchoring unit 31 engage the neck portions 211 of the first engaging posts 21 of the first engaging unit for positioning. Subsequently, the upper plate portions 3221 of the U-shaped plates 322 of the second anchoring unit 32 are pressed downwardly such that the lower plate portions 3222 of the U-shaped plates 322 slightly deform to move downwardly past the convex top surfaces 241 of the head portions 24. Finally, the second engaging posts 22 of the second engaging unit engage the notches 32224 in the lower plate portions 3222 and at the same time the resilient lateral plates 302 deform so as to generate a downward restoring force acting on the abutting plate 301 to bias the heat transfer plate 10 toward the electronic component 5. Therefore, heat-conductive contact between the heat transfer plate 10 and the electronic component 5 can be ensured.

It is noted that, due to the presence of the anchoring device 3, the heat dissipating assembly of this invention can be easily assembled on the circuit board 4. Furthermore, the restoring force acting on the abutting plate 301 is evenly applied to the die portion 51 of the electronic component 5 so as to prevent damage at edges of the electronic component 5.

Figure 5:
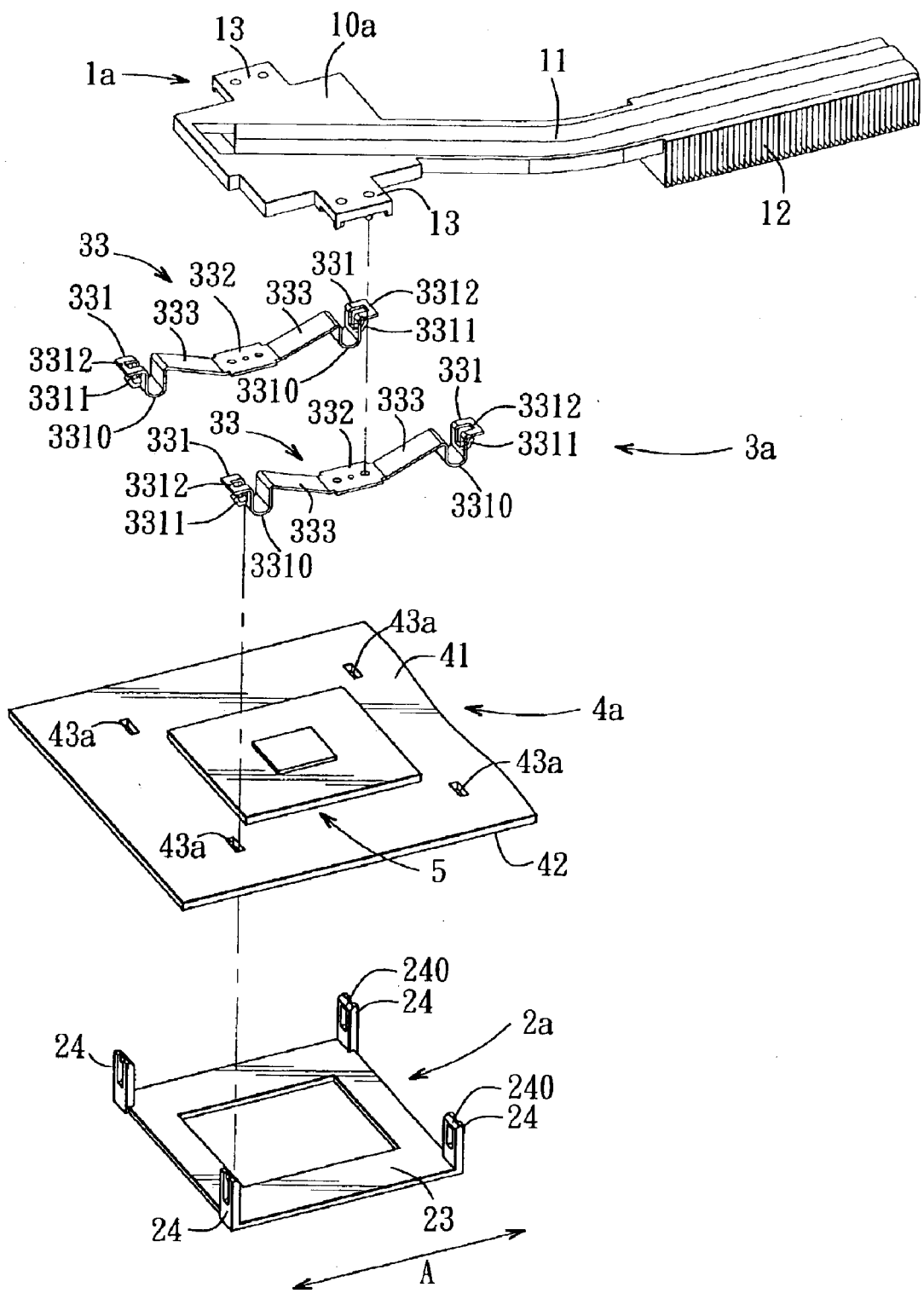
FIG. 5 is an exploded perspective view showing the second preferred embodiment of a heat dissipating assembly according to the present invention.
Figure 6:
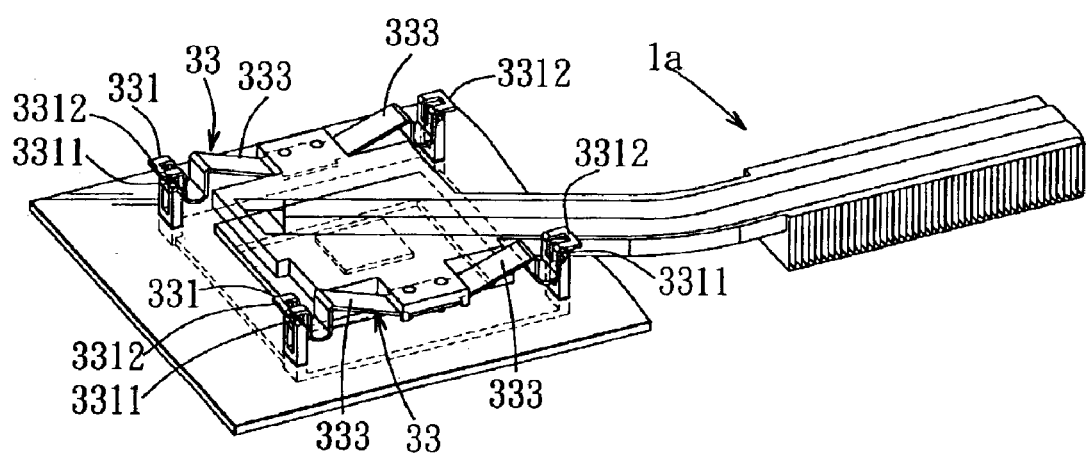
FIG. 6 is a perspective view showing the second preferred embodiment.

FIGS. 5 and 6 illustrate the second preferred embodiment of a heat dissipating assembly according to this invention, which is a modification of the first preferred embodiment. Unlike the previous embodiment, the anchoring device (3a) includes two anchoring members 33, each of which has an abutting portion 332, two resilient portions 333 extending in the first direction (A) and inclining upwardly from opposite sides of the a butting portion 332, and first and second engaging hooks 331, which are identical to each other, connected to the resilient portions 333, respectively. The first engaging hooks 331 of the anchoring member 33 serve as the first anchoring unit of the anchoring device (3a). The second engaging hooks 331 of the anchoring member 33 serve as the second anchoring unit of the anchoring device (3a) The abutting portions 332 and the resilient portions 333 of the anchoring members 33 serve as the abutting unit of the anchoring device (3a). The abutting portions 332 of the anchoring members 33 are fastened to opposite protrusions 13 extending outwardly from opposite sides of the heat transfer plate (10a) of the heat-dissipating module (1a), respectively. In this embodiment, each of the first and second engaging hooks 331 of each anchoring member 33 includes a U-shaped plate 3310 with opposite lateral plate portions, one of which is connected to one of the resilient portions 333, a pressing plate 3312 extending outwardly in the first direction (A) and connected to the other one of the lateral plate portions of the U-shaped plate 3310, and a tab 3311 extending outwardly from the other one of the lateral plate portions of the U-shaped plate 3310 in the first direction (A) and inclining upwardly. The abutting portion 332, the resilient portions 333 and the first and second engaging hooks 331 of each anchoring member 33 are formed integrally by stamping.

In this embodiment, the first and second engaging units of the base frame (2a) are identical to each other. Each of the first and second engaging units includes two ring members 24. Each of the ring members 24 has an upper ring portion 240 that engages a corresponding one of the first and second engaging hooks 331 of the anchoring members 33.

During assembly, the base frame (2a) is first disposed on the second surface 42 of the circuit board (43a) such that the ring members 24 of the first and second engaging units extend through the through holes (43a) in the circuit board (4a). Then, the pressing plates 3312 of the first and second engaging hooks 331 of the anchoring members 33, which are fastened to the heat transfer plate (10a), are pressed downwardly by using a pressing tool (not shown) such that the tabs 3311 of the first and second engaging hooks 331 deform so as to enable the upper ring portions 240 of the ring members 24 of the first and second engaging units to be retained between the pressing plates 3312 and the tabs 3311, as shown in FIG. 6. At the same time, the resilient portions 333 deform so as to generate a downward restoring force acting on the abutting portions 332 to bias evenly the heat transfer plate (10a) toward the electronic component 5.

Figure 7:
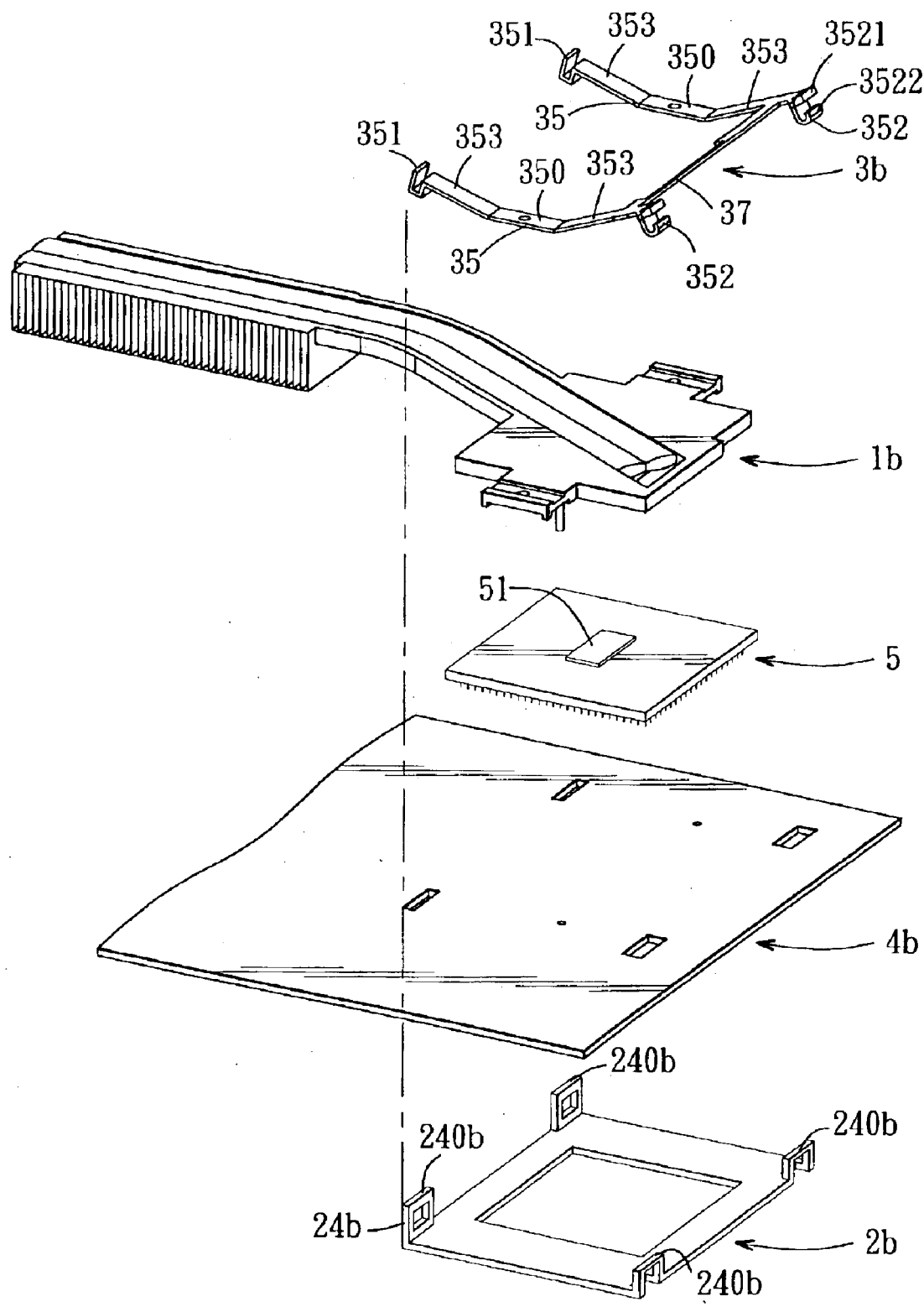
FIG. 7 is an exploded perspective view showing the third preferred embodiment of a heat dissipating assembly according to the present invention.
Figure 8:
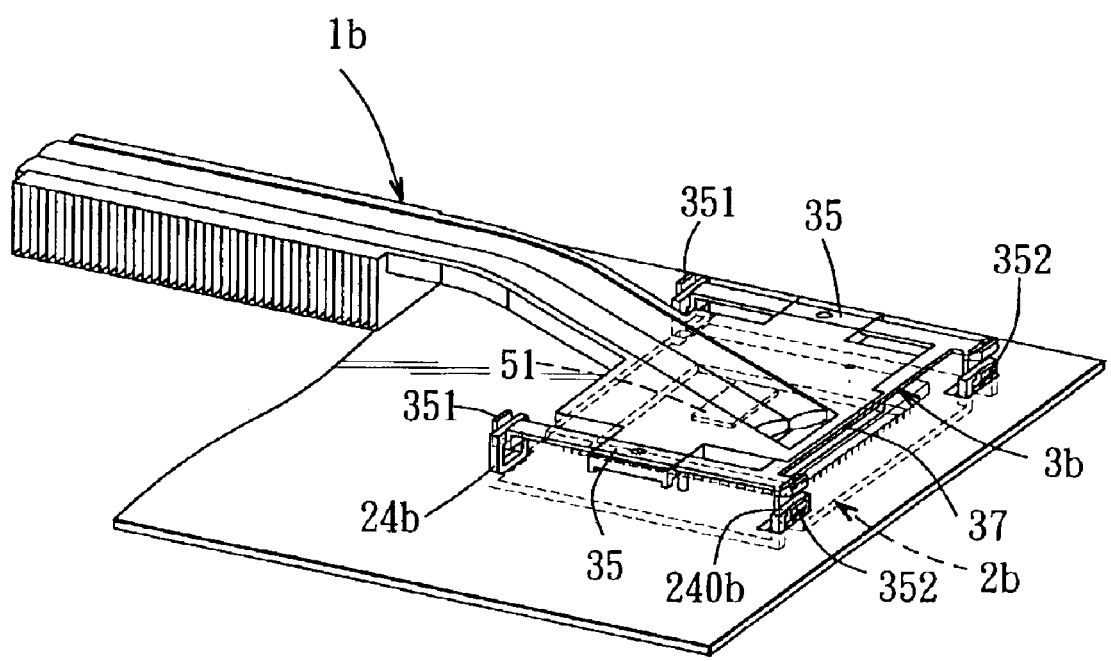
FIG. 8 is a perspective view showing the third preferred embodiment.

FIGS. 7 and 8 illustrate the third preferred embodiment of a heat dissipating assembly according to this invention, which is a modification of the second preferred embodiment. Unlike the second preferred embodiment, the first engaging hook 351 of each anchoring member 35 of the anchoring device (3b) includes an upwardly opening U-shaped plate. The second engaging hook 352 of each anchoring member 35 of the anchoring device (3b) includes a pressing portion 3521 extending from and connected to a corresponding one of the resilient portions 353, and a downwardly extending hook portion 3522. The anchoring device (3b) further includes a coupling portion 37 interconnecting the resilient portions 353 of the anchoring members 35.

During assembly, the first engaging hooks 351 of the anchoring member 35 initially engage the upper ring portions (240b) of the ring members (24b) of the first engaging unit. Then, the pressing portions 3521 of the second engaging hooks 352 are pressed downwardly such that the hook portions 3522 of the second engaging hooks 352 deform so as to engage the upper ring portions (240b) of the ring members (24b) of the second engaging unit, as shown in FIG. 8. At the same time, the resilient portions 353 deform so as to generate a downward restoring force acting on the abutting portions 350 to bias evenly the heat transfer plate (10b) toward the electronic component 5.

Figure 9:
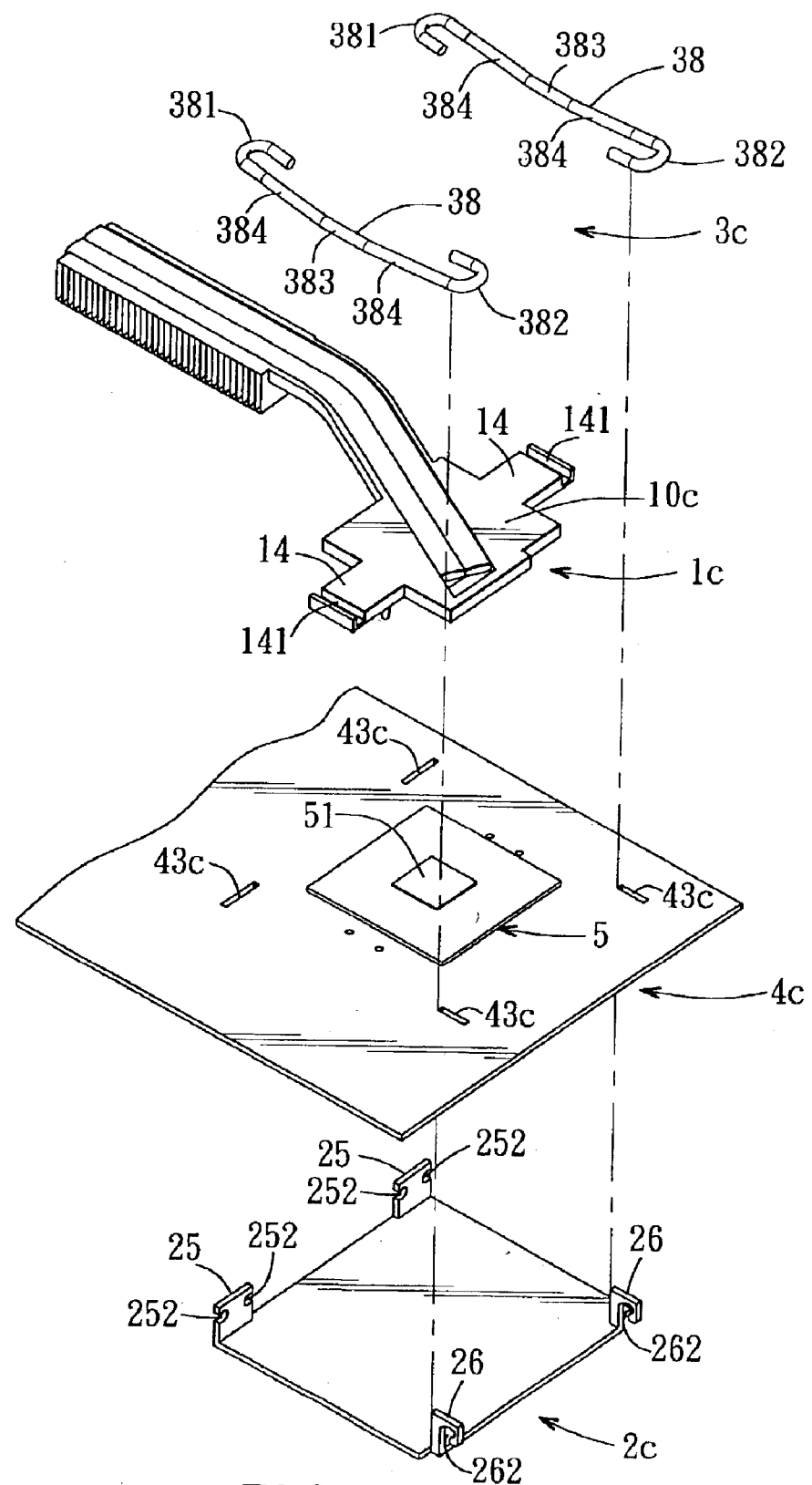
FIG. 9 is an exploded perspective view showing the fourth preferred embodiment of a heat dissipating assembly according to the present invention.
Figure 10:
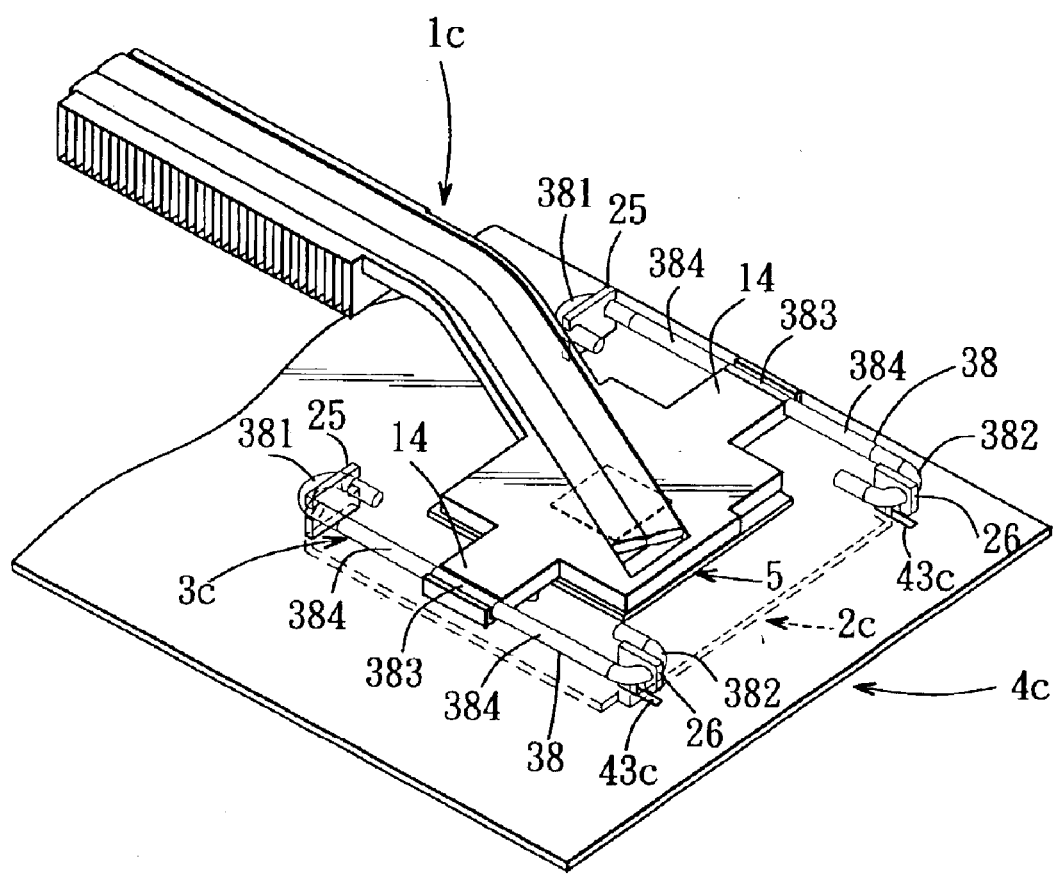
FIG. 10 is a perspective view showing the fourth preferred embodiment.

FIGS. 9 and 10 illustrate the fourth preferred embodiment of a heat dissipating assembly according to this invention, which is a modification of the previous embodiments. Unlike the second and third preferred embodiments, the first engaging unit includes two engaging plates 25, each of which is formed with opposite notches 252 that engage a corresponding one of the first engaging hooks 381 of the anchoring members 38. The second engaging unit includes two lugs 26, each of which is formed with a downwardly opening notch 262 that engages a corresponding one of the second engaging hooks 382 of the anchoring members 38. The abutting portions 383 of the anchoring members 38 are engaged in engaging grooves 141 formed in the protrusions 14 of the heat transfer plate (10c) of the heat-dissipating module (1c) respectively.

During assembly, the first engaging hooks 381 of the anchoring member 38 initially engage the notches 252 in the engaging plates 25 of the first engaging unit. Then, the second engaging hooks 382 of the anchoring members 38 are pressed downwardly such that the second engaging hooks 382 of the anchoring members 38 deform so as to engage the notches 262 in the lugs 26 of the second engaging unit, as shown in FIG. 10. At the same time, the resilient portions 384 deform so as to generate a downward restoring force acting on the abutting portions 3393 to bias evenly the heat transfer plate (10c) toward the electronic component 5.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A heat dissipating assembly adapted to be provided on a circuit board for dissipating heat produced by an electronic component that is mounted on a first surface of the circuit board, the circuit board further having a second surface opposite to the first surface and being formed with a set of through holes, each of which extends from the first surface to the second surface, said heat dissipating assembly comprising:

a base frame adapted to be disposed on the second surface of the circuit board and including a bottom part with first and second sides opposite to each other in a first direction, said first side being formed with a first engaging unit extending upwardly therefrom, said second side being formed with a second engaging unit extending upwardly therefrom, each of said first and second engaging units being adapted to extend through the through holes in the circuit board;

a heat-dissipating module adapted to be mounted on the circuit board and including a heat transfer plate adapted to be disposed on and to establish heat-conductive contact with the electronic component; and an anchoring device including a first anchoring unit that engages said first engaging unit, a second anchoring unit that engages said second engaging unit, and an abutting unit connected to said first and second anchoring units, said anchoring device biasing said heat transfer plate of said heat-dissipating module toward the electronic component when said first and second anchoring units engage said first and second engaging units, wherein:

said first engaging unit includes a first engaging post with a diameter-reduced neck portion;

said second engaging unit including a second engaging post, and an enlarged head portion provided on a top end of said second engaging post and formed with a convex top surface;

said first anchoring unit including a forked plate that engages said neck portion of said first engaging post;

said second anchoring unit including a U-shaped plate that has upper and lower plate portions, and an intermediate plate portion interconnecting said upper and lower plate portions, said lower plate portion being formed with a notch that is slightly smaller than a largest diameter of said head portion on said second engaging post, said second engaging post engaging said notch and said head portion being retain between said upper and lower plate portions when said second anchoring unit engages said second engaging unit.

2. The heat dissipating assembly as claimed in claim 1, wherein said abutting unit includes an abutting plate, and opposite resilient lateral plates extending in the first direction and inclining upwardly from opposite sides of said abutting plate and connected respectively to said forked plate and said upper plate portion of said U-shaped plate.

3. The heat dissipating assembly as claimed in claim 2, wherein said forked plate, said U-shaped plate, said resilient lateral plates and said abutting plate are formed integrally.

4. A heat dissipating assembly adapted to be provided on a circuit board for dissipating heat produced by an electronic component that is mounted on a first surface of the circuit board, the circuit board further having a second surface opposite to the first surface and being formed with a set of through holes, each of which extends from the first surface to the second surface, said heat dissipating assembly comprising:

a base frame adapted to be disposed on the second surface of the circuit board and including a bottom part with first and second sides opposite to each other in a first direction, said first side being formed with a first engaging unit extending upwardly therefrom, said second side being formed with a second engaging unit extending upwardly therefrom, each of said first and second engaging units being adapted to extend through the through holes in the circuit board;

a heat-dissipating module adapted to be mounted on the circuit board and including a heat transfer plate adapted to be disposed on and to establish heat-conductive contact with the electronic component; and an anchoring device including a first anchoring unit that engages said first engaging unit, a second anchoring unit that engages said second engaging unit, and an abutting unit connected to said first and second anchoring units, said anchoring device biasing said heat transfer plate of said heat-dissipating module toward the electronic component when said first and second anchoring units engage said first and second engaging units, wherein said anchoring device includes two anchoring members, each of which has an abutting portion, two resilient portions extending in the first direction and including upwardly from opposite sides of said abutting portion, and first and second engaging hooks connected to said resilient portions, respectively, said first engaging hooks of said anchoring members serving as said first anchoring unit of said anchoring device, said second engaging hooks of said anchoring members serving as said second anchoring unit of said anchoring device.

5. The heat dissipating assembly as claimed in claim 4, wherein each of said first and second engaging units includes two ring members, each of said ring members having an upper ring portion that engages a corresponding one of said first and second engaging hooks.

6. The heat dissipating assembly as claimed in claim 4, wherein said anchoring device further includes a coupling portion interconnecting said anchoring members.

7. The heat dissipating assembly as claimed in claim 4, wherein said first engaging unit includes two engaging plates, each of which is formed with opposite notches that engage a corresponding one of said first engaging hooks of said anchoring members, said second engaging unit including two lugs that engage said second engaging hoc of said anchoring members.

* * * * *